(12) United States Patent
Babikian

(10) Patent No.: US 8,631,967 B2
(45) Date of Patent: Jan. 21, 2014

(54) SENSOR PROTECTOR

(75) Inventor: Dikran Babikian, Glendale, CA (US)

(73) Assignee: Bobrick Washroom Equipment, Inc., North Hollywood, CA (US)

( * ) Notice: Subject to any disclaimer, the term of this patent is extended or adjusted under 35 U.S.C. 154(b) by 217 days.

(21) Appl. No.: 13/253,790

(22) Filed: Oct. 5, 2011

(65) Prior Publication Data

US 2012/0085776 A1 Apr. 12, 2012

Related U.S. Application Data

(60) Provisional application No. 61/390,586, filed on Oct. 6, 2010.

(51) Int. Cl.
*A47K 10/00* (2006.01)
(52) U.S. Cl.
USPC .............................................. 221/13; 242/563
(58) Field of Classification Search
USPC ........................................... 221/13; 242/563
See application file for complete search history.

(56) References Cited

U.S. PATENT DOCUMENTS

| | | | | |
|---|---|---|---|---|
| 7,523,885 B2 * | 4/2009 | Lewis | ........................... | 242/563 |
| 7,793,882 B2 * | 9/2010 | Reinsel et al. | ................ | 242/563 |
| 7,931,228 B2 * | 4/2011 | Omdoll | ......................... | 242/563 |
| 8,395,396 B2 * | 3/2013 | Hagleitner | .................... | 324/686 |

* cited by examiner

*Primary Examiner* — Timothy Waggoner
(74) *Attorney, Agent, or Firm* — Christie, Parker & Hale, LLP

(57) ABSTRACT

A method for preventing recalibration of an automated product dispenser, a sensor protector for a product dispenser, and a product dispenser including a housing having a sensor area, a capacitive sensor adjacent a first surface of the sensor area of the housing, where the sensor has a target sensing area extending through the first surface and beyond a second surface of the housing opposite the first surface in a direction away from the first surface and a sensor protector which includes a plurality of spaced apart projections extending from the second surface in the direction away from the first surface.

12 Claims, 6 Drawing Sheets

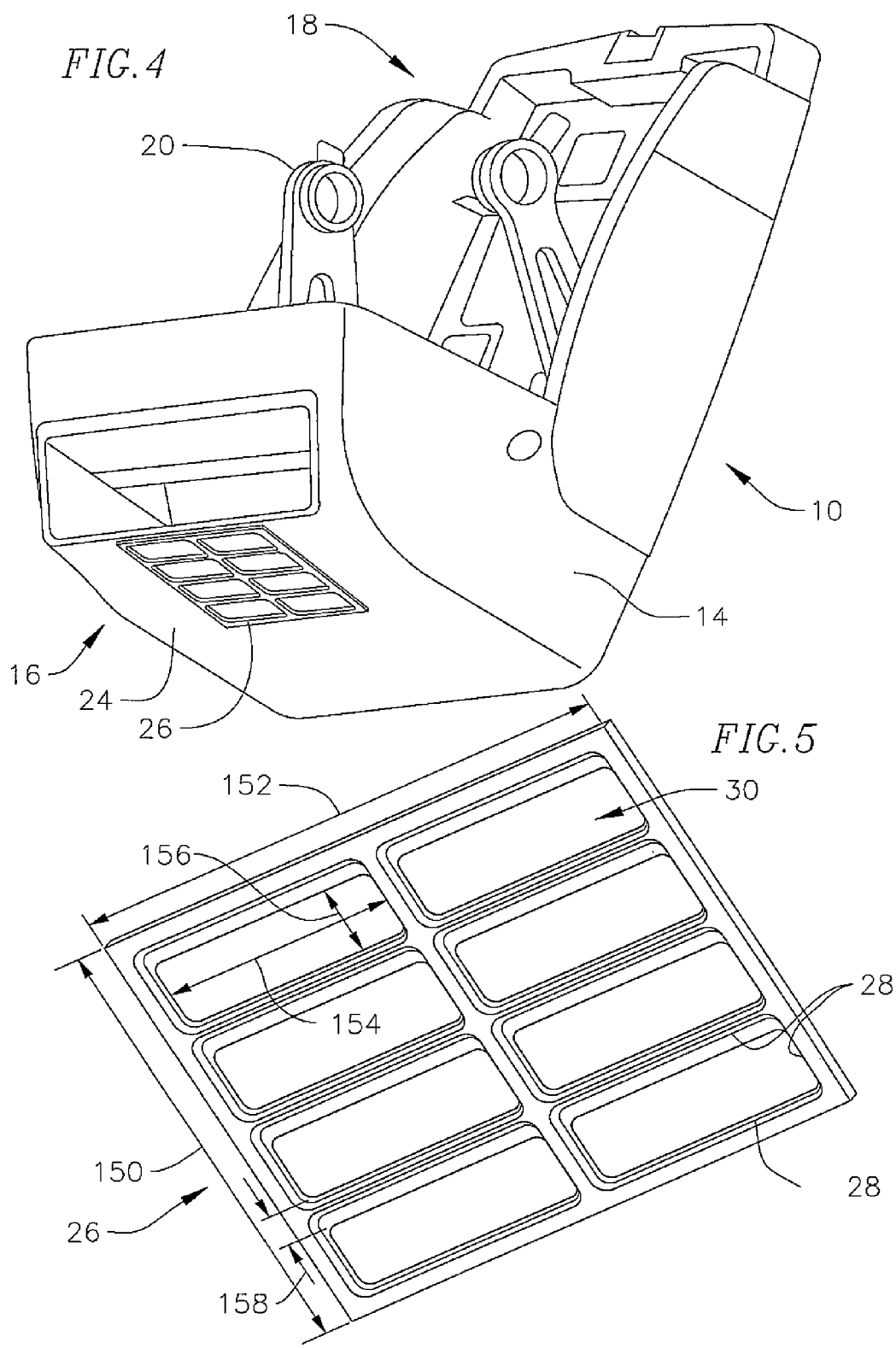

SENSOR PROTECTOR

CROSS-REFERENCE TO RELATED APPLICATION

This application claims the benefit of and priority to U.S. Provisional Application No. 61/390,586, filed Oct. 6, 2010, the contents of which are fully incorporated herein by reference.

BACKGROUND OF THE INVENTION

The invention is a sensor protector for automatic product dispensers that include a capacitive sensor, which sensor protector provides an obstacle to prevent excess liquid from collecting on or near a sensor area in front of the capacitive sensor of the automatic product dispenser, and a method to eliminate a need for recalibration of the capacitive sensor which can otherwise occur when the sensor area in front of the capacitive sensor becomes moist or wet.

Automated dispensers of all types, such as roll paper towel dispensers, are popular in public settings since they address a need to provide a hands free way of dispensing various products, e.g., paper towels, without a user having to operate a lever, etc., to dispense the product. This helps to maintain a sanitary environment. Also, since the automatic dispensers can be set to dispense a predetermined amount of product and at predetermined intervals between dispensing the product, such automatic dispensers can help reduce product waste.

A technology used to activate the automatic dispenser is capacitive sensing, wherein a capacitive sensor (a.k.a. capacitive displacement sensor) detects a change in capacitance when something, e.g., fingers or the hands of a user, approaches the capacitive sensor, i.e., approaches a target sensing area of the capacitive sensor. The capacitive sensors function as proximity sensors. When this occurs, the capacitive sensor sends a signal to a dispenser mechanism of a dispenser, which then dispenses the product. In typical applications, the capacitive sensor is mounted inside of a plastic housing of the automatic dispenser. The thickness of the plastic in front of the sensor (the sensor area) is thin enough so that the capacitive sensor will function when a hand or fingers are placed in close proximity to the sensor area outside of the housing. Capacitive sensors are well known in the art.

In order to use the automatic dispenser, a user will place his or her hands near the sensor area outside the housing. The capacitive sensor will detect the presence of the user's hand, and will cause the automatic dispenser, e.g., an automatic roll paper towel dispenser, to dispense a length of paper towel. Sometimes a user will touch the sensor area of the housing with wet hands, leaving the sensor area moist or wet. If and when a wet hand touches the sensor area behind which the capacitive sensor is located, particularly if a lot of liquid collects on the sensor area, the capacitive sensor will often lose its set point and will temporarily be inoperative until the capacitive sensor goes through a recalibrate process. During this recalibration process, which can take thirty seconds or longer, the automatic roll paper towel dispenser will not operate. When this happens, the user may mistakenly believe that the automatic roll paper towel dispenser is out of paper or non-functional. Particularly in heavy use situations, such delays are problematic. By preventing excess liquid from accumulating on or near the sensor area, the invention prevents the need for recalibration and the associated confusion and delays caused by recalibration. As such, a device and method are desired that will prevent such problems.

SUMMARY OF THE INVENTION

The sensor protector of the invention helps to alleviate the need for recalibration and attendant delays by providing a protection barrier or grid in front of the sensor area. The sensor protector can, for example, provide a surface of perforated material that is located in front of the sensor area. The perforations or matrix of openings in the sensor protector prevent water from the user's hands from collecting on or near the sensor area. It has been found that a ratio of about 70% to 99% open area to about 1% to 30% solid area in the sensor protector functions well. The sensor protector reduces or eliminates the area and amount of moisture or liquid that can collect on or in the vicinity of the sensor area so that a recalibration of the sensor does not occur even if a user attempts to touch the sensor area or the vicinity of the sensor area with wet hands. The size and shape of the openings in the sensor protector are designed so that a user's hands cannot readily touch the sensor area but instead touch the barrier or grid surface. The perforations in the sensor protector can be any shape or configuration as long as they reduce the area that water can cling to the sensor surface. The sensor protector can be mounted by any method. Also, instead of providing a separate sensor protector, a sensor protection barrier or grid area can be integrally formed together with a separate housing for the automatic product dispenser. Instead of a grid, the sensor protect may also comprise spaced apart protrusions which downwardly extend from the sensor area and help prevent a user's wet hands from depositing liquid on the sensor area or a vicinity thereof, and to the extent that liquid does get deposited on the sensor area and/or the protrusions, the amount of liquid will not be great enough to interfere with the function of the capacitive sensor and/or to trigger the recalibration cycle and delays caused by recalibration.

In a first exemplary embodiment a product dispenser is provided including a housing having a sensor area and a capacitive sensor adjacent a first surface of the sensor area of the housing, where the sensor has a target sensing area extending through the first surface and beyond a second surface of the housing opposite the first surface in a direction away from the first surface. The first exemplary embodiment dispenser also includes a sensor protector which includes a plurality of spaced apart projections extending from the second surface in the direction away from the first surface. In a further exemplary embodiment, the projections are a plurality of crossing members defining a grid having a plurality of openings defined by the crossing members. In another exemplary embodiment, the projections are conical shaped. In yet a further exemplary embodiment, the protector includes a base, the projections extend from the base and the base is adjacent the second surface. In yet another exemplary embodiment, the projections are integrally formed with the base. In a further exemplary embodiment, the projections are integrally formed with the second surface. In yet a further exemplary embodiment, the projections extend a distance of at least ¼ inch perpendicularly away from the second surface. In another exemplary embodiment, the sensor activates a mechanism for dispensing a product. In yet another exemplary embodiment, the sensor activates a mechanism for dispensing paper towels.

In a further exemplary embodiment, a method for preventing recalibration of an automated product dispenser that includes a capacitive sensor having a target sensing area through a first surface in a section of a housing and beyond a second surface of the section of the housing opposite the first surface is provided. The dispenser dispenses a product when an object is sensed in the target sensing area. The method of this exemplary embodiment includes providing a sensor protector including a plurality of spaced apart projections over a section of the second surface for reducing the amount of liquid and/or moisture being deposited on the section of the second surface. In yet a further exemplary embodiment, the product is a paper towel.

In another exemplary embodiment, a sensor protector for use with an automatic product dispenser including a plurality of projections is provided. The sensor protector is mountable in the vicinity of a sensor area of a capacitive sensor of an automatic dispenser for reducing an amount of liquid and/or moisture being deposited on the sensor area.

BRIEF DESCRIPTION OF THE DRAWINGS

FIG. 4 is bottom perspective view of the exemplary automatic roll paper towel dispenser of FIG. 2 but with the exemplary sensor protector affixed to the front of the sensor area of the automatic roll paper towel dispenser.

FIG. 5 is a perspective view of the exemplary sensor protector of FIGS. 2-4.

DETAILED DESCRIPTION

Figure 1:
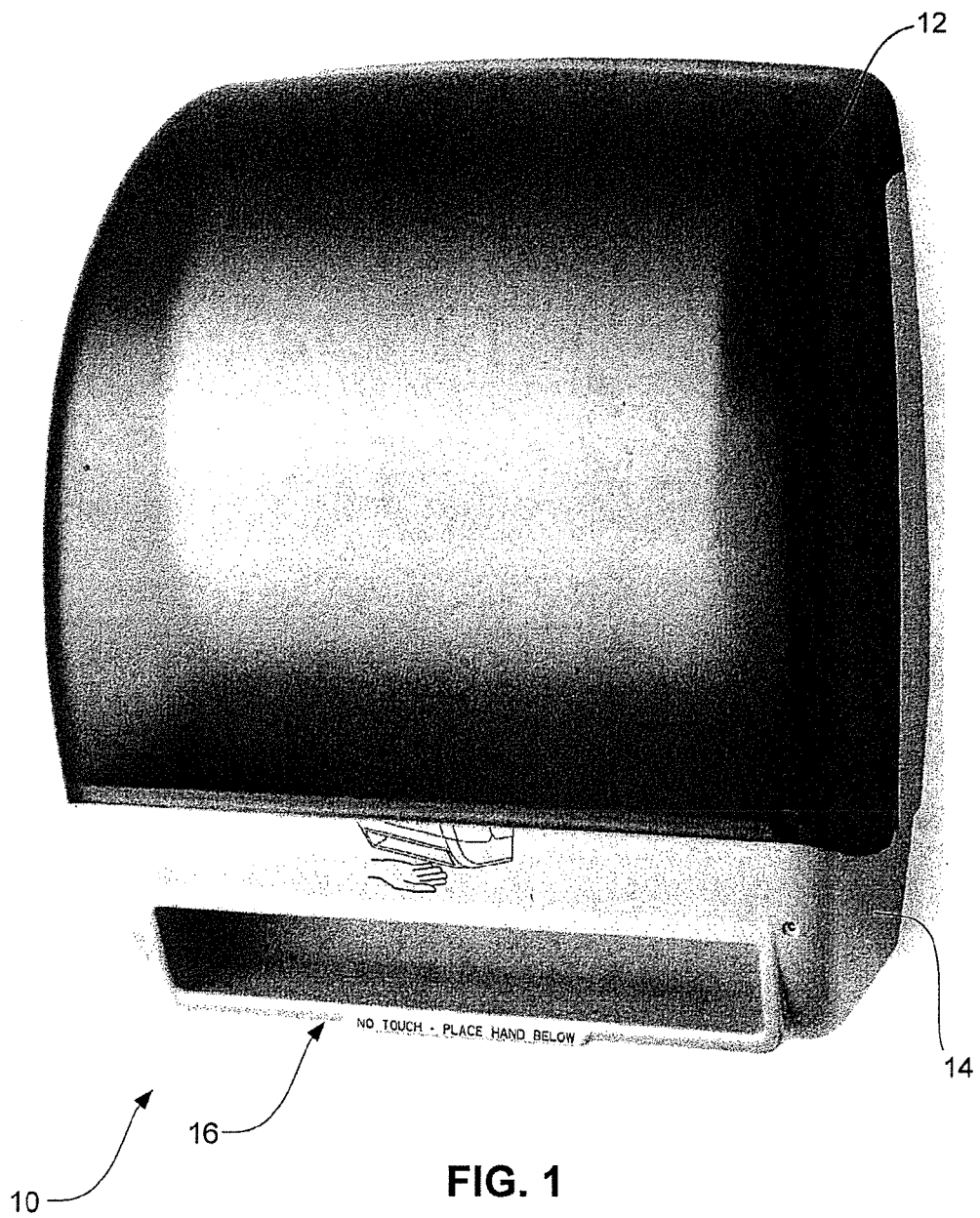
FIG. 1 is a front perspective view of an exemplary automatic roll paper towel dispenser having an exemplary sensor protector of the invention and is shown with a dispenser cover in place.
Figure 2:
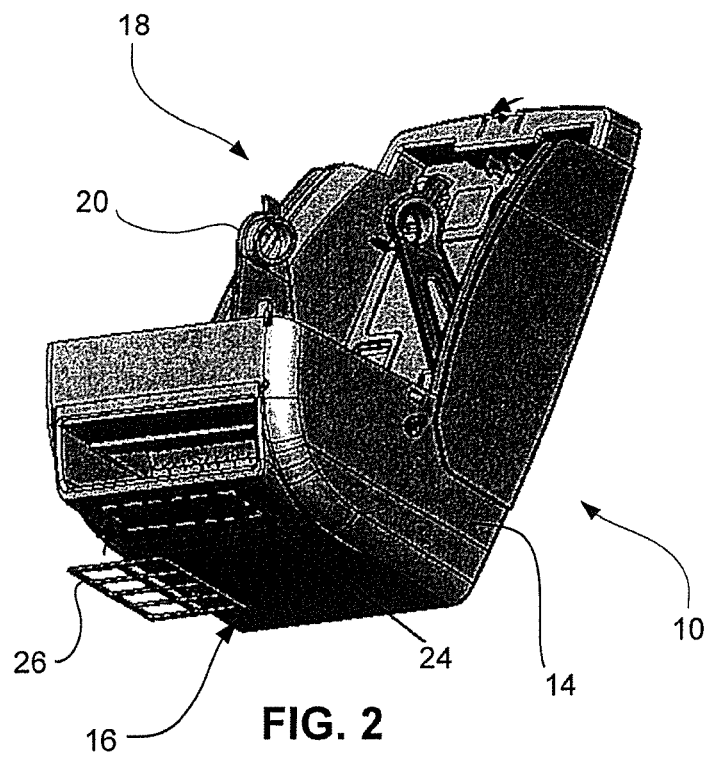
FIG. 2 is bottom perspective view of the exemplary automatic roll paper towel dispenser with an exemplary sensor protector of FIG. 1 with the dispenser cover removed and with the exemplary sensor protector shown displaced from its position in front of a sensor area of the automatic roll paper towel dispenser.
Figure 3:
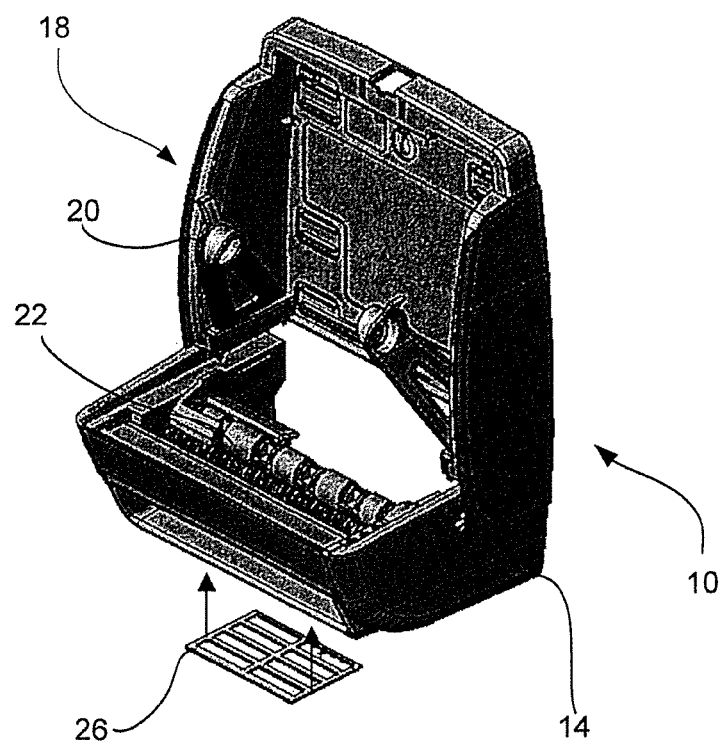
FIG. 3 is a front perspective view of the exemplary automatic roll paper towel dispenser of FIG. 2.

FIGS. 1-4 are views of an exemplary automatic roll paper towel dispenser 10. FIG. 1 is a front perspective view of the exemplary automatic roll paper towel dispenser 10 with a cover 12 in place and attached to a housing 14. The housing 14 can preferably be formed of plastic. As best shown in FIGS. 2-4, the housing has an underside 16, an interior region 18 with roll paper towel holding arms 20, and dispensing rollers 22 which are activated to dispense a predetermined length of roll paper towel (not shown) when the automatic roll paper towel dispenser 10 is activated. At the underside 16 of the housing 14 there is a sensor area 24, which comprises an area of the housing 14 that lies in front of a capacitive sensor (not shown) that is positioned in the housing 14 above the sensor area 24. The sensor area 24 preferably comprises a layer of plastic material in front of the capacitive sensor. In FIGS. 2 and 3, the exemplary sensor protector 26 is shown before being attached in front of the sensor area 24 of the housing 14. The sensor protector 26 can be attached by adhesives, by snap fittings, screws, other fixtures (not shown) or any other desired attachments. FIG. 4 shows the sensor protector 26 after being affixed in front of the sensor area 24 of the housing 14.

FIG. 5 is a perspective view of an exemplary embodiment of the sensor protector 26 which is in the form of a separate protection grid that includes grid walls 28 that define openings 30 there between. By way of example, in one application, the sensor protector 26 shown in FIG. 5 can sized about 4.25 inches in length 150 by 2.5 inches in width 152, with each opening 30 having a length 154 about 2 inches and a width 156 of about ½ inch and with the separate grid walls 28 having a width 158 in the range of about 0.25 inch to about 0.375 inch wide. The grid walls may be preferably be between about 0.25" and 1" wide. In an exemplary embodiment, the grid walls have a height 160 not greater than 1 inch. In another exemplary embodiment, the grid walls have a height 160 as measured perpendicular to a plane defined by the length 154 and the width 156 (FIG. 6). not greater than 0.25 inch. The grid walls 28 are high enough and the openings 30 are sized so that even if the sensor protector 26 is touched by a user's wet hands, water will collect but to a lesser degree and on a smaller continuous area on the sensor protector 26 on to the grid walls 28, and thereby prevent recalibration and incapacity of the capacitive sensor. For the sensor protector 26, it has been found that a ratio of about 70% to 99% open areas of openings 30 to about 1% to 30% solid area, viz., grid walls 28) functions well. The size and shape of the openings 30 and the position, size and shape of the grid walls in the sensor protector 26 are designed so that a user's entire hand cannot readily touch the sensor area but instead touch the grid walls 28 or a smaller section of the sensor area. The openings 30 in the sensor protector 26 can be any shape or configuration as long as they reduce or eliminate the area that water can cling to the sensor area 24. Although the sensor protector 26 is shown as having a generally rectangular grid layout of the grid walls 28 and generally rectangular opening 30, the grid walls 28 and grid opening 30 can be of any desired shape and size.

Even if the user of an automatic product dispenser touches the sensor protector 26, the amount of the water that collects on the sensor protector 26 and/or the sensor area 24 will not be significant enough to interfere with the function of the capacitive sensor and cause it to recalibrate, and thus users will be able to use the automatic product dispenser normally and without any recalibration delays. The sensor protector 26 can be mounted to the housing 14 in front of the sensor area 24 by adhesives, sonic welding, screws, rivets, snap fittings, and other known attachments (not shown).

Figure 6:
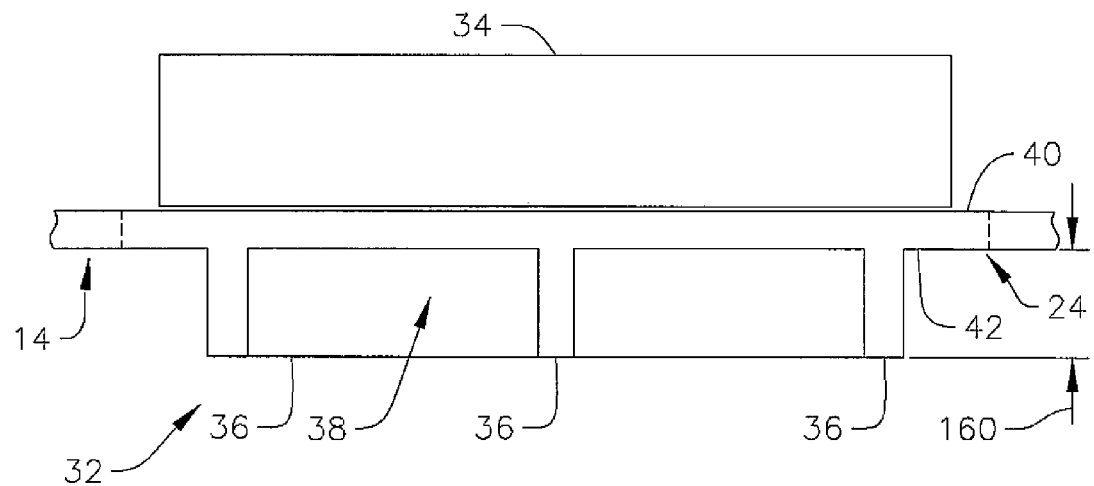
FIG. 6 is a partially exposed side view of another exemplary embodiment of the sensor protector of the invention wherein the sensor protector is integrally formed with the plastic material below the capacitive sensor in the sensor area of the housing of the automatic product dispenser.

In lieu of providing a separate sensor protector 26 that is attached to the sensor area 24 of the housing, FIG. 6 is a partially exposed side view of an exemplary embodiment of a sensor protector 32 that is formed integrally with the plastic material in sensor area 24, wherein a capacitive sensor 34 is positioned above an upper surface 40 of the sensor area 24 of the housing 14, and raised walls 36 extend downwardly from a lower surface 42 of the plastic material in the sensor area 24, with openings 38 formed between the walls 36.

Figure 7:
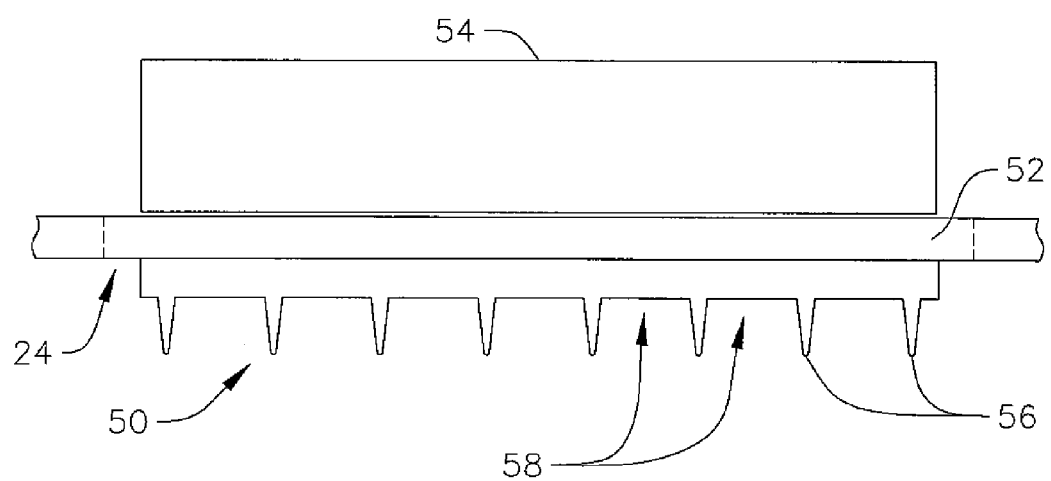
FIG. 7 is a partially exposed side view of another exemplary embodiment of a sensor protector of the invention positioned below a sensor area of an automatic product dispenser.

FIG. 7 is a side view showing another exemplary embodiment of a sensor protector 50 of the invention positioned in a sensor area 24 of an automatic roll paper towel dispenser. The sensor protector 50 is positioned below a layer of plastic material 52 of the housing of the automatic roll paper towel dispenser, and the capacitive sensor 54 is located above the layer of plastic material 52. The sensor area 24 is generally the area of plastic material 52 below the capacitive sensor 54. In this exemplary sensor protector 50, instead of grid walls, a plurality of spaced apart protrusions 56 extend downwardly from the sensor protector 50. The protrusions 56 prevent a user from touching the area of the plastic material in the sensor area 24 and depositing liquid thereon. The lower ends of the protrusions 56 also have a generally small enough surface area so that even if liquid is deposited on the ends of all of the protrusions 56, the amount of liquid deposited will not interfere with the operation of the capacitive sensor 54. The protrusions 56 and the spaces 58 therebetween are sized and shaped so that capacitive sensor's 54 ability to detect changes in capacitance caused by placing a hand in the vicinity of the sensor is unimpeded. The protrusions 56 and spaces 58 can be any shape or configuration as long as they reduce the area that water can cling to the sensor area 24 and/or to the protrusions 56. In an exemplary embodiment as shown in FIG. 7, the protrusions may be conical shaped. In one exemplary embodiment, a maximum diameter of such conical protrusion is less than ¼ inch.

Figure 8:
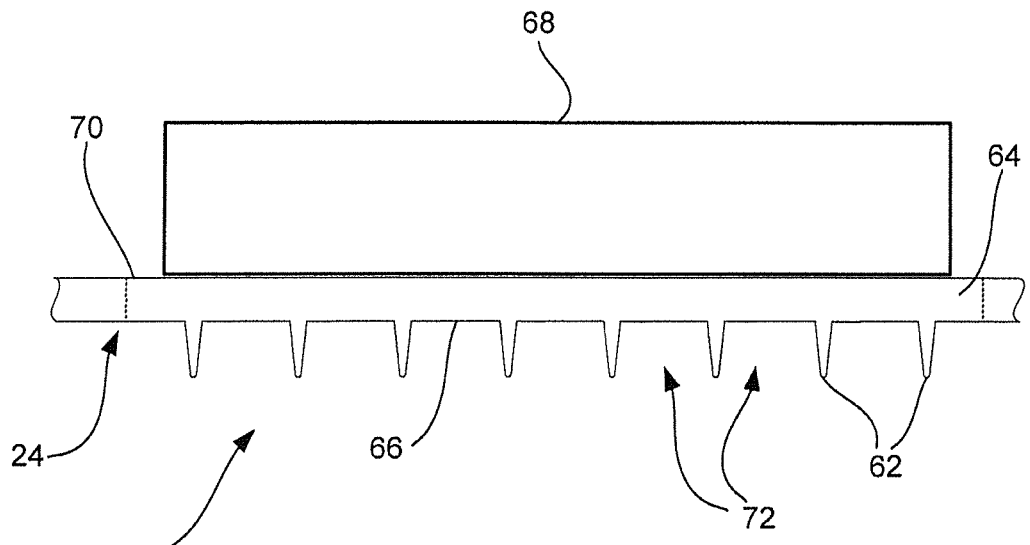
FIG. 8 is a side view of a further exemplary embodiment of a sensor protector of the invention wherein protrusions thereof extend directly below the sensor area of an automatic product dispenser.
Figure 9:
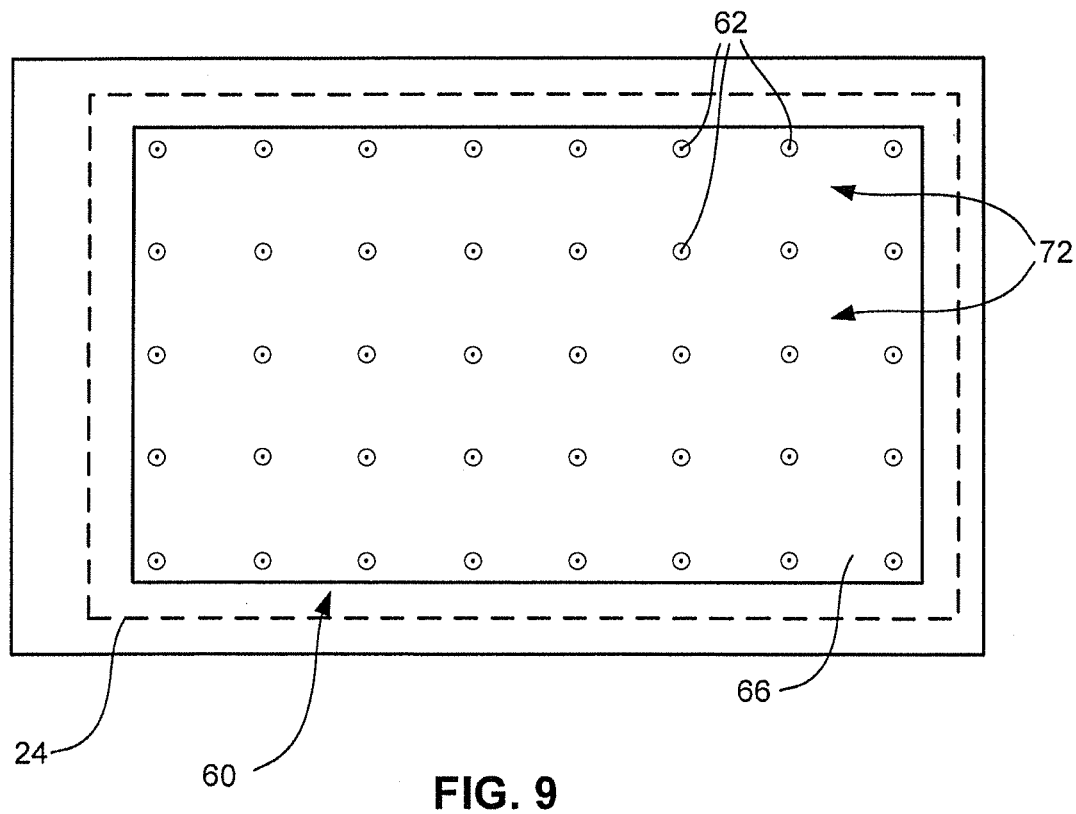
FIG. 9 is a bottom view of the sensor protector of FIG. 8.

FIGS. 8 and 9 are a side view and bottom view, respectively, of another embodiment of a sensor protector 60. This sensor protector 60 is similar to the sensor protector of FIG. 7, except that sensor protector 60 has spaced apart protrusions 62 which are integrally formed with plastic material 64 defining the sensor area 24 in housing 14, with the protrusions 62 extending downwardly from a lower surface 66 of the plastic material 64, and with the capacitive sensor 68 located above an upper surface 70 of the plastic material 64. Spaces 72 are located between the protrusions 62. The protrusions 62 help prevent or lessen liquid from a user's hands from being deposited on the lower surface 66 of the plastic material 64 in the sensor area 24, and to the extent that any liquid is deposited on the protrusions 62, the liquid is of insufficient quantity to interfere with the operation of the capacitive sensor 68 of the automatic product dispenser. The protrusions 62 are long enough but not too long, e.g., between about 0.25" and 1.0", and are spaced far enough apart so that a user's hands can be placed close enough to be detected by the capacitive sensor 68, but still prevent enough liquid from being deposited on the sensor area 24 and/or on the protrusions 62 such that the liquid would interfere with the operation of the automatic product dispenser. In an exemplary embodiment as shown in FIG. 9, the protrusions are conical in shape. In one exemplary embodiment, a maximum diameter of each such conical protrusion is less than ¼ inch.

Figure 10:
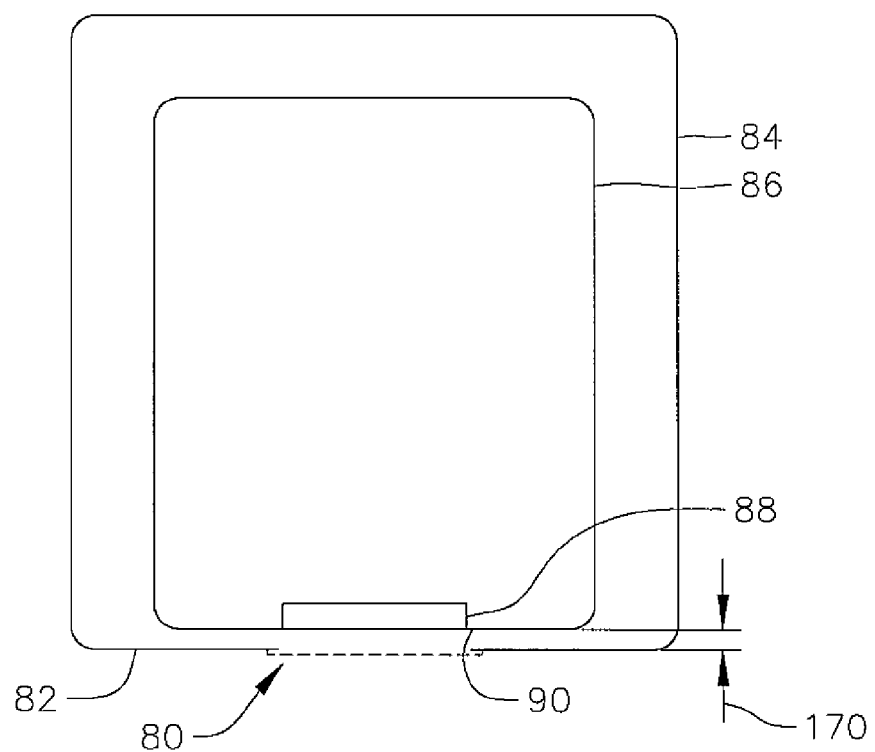
FIG. 10 is a diagrammatic view of a further exemplary embodiment of a sensor protector of the invention.

FIG. 10 is a diagrammatic view of another exemplary embodiment of a sensor protector 80 of the invention, which is located at the bottom 82 of a secondary enclosure cabinet 84, such as made out of metal or plastic, in which secondary enclosure cabinet 84 is located an automatic product dispenser 86. In commercial applications, the secondary enclosure cabinet 84 is metal, e.g., stainless steel. The metal is cut out at a bottom thereof and the sensor protector 80 is placed in front of, or in, or is aligned with the cutout as the metal may prevent the capacitive sensor from properly functioning. The automatic product dispenser 86 has a capacitive sensor 88 located above a sensor area 90. The automatic product dispenser 86 is placed in the secondary enclosure cabinet 84 such that its sensor area 90 is spaced a distance is above the sensor protector 80 of the secondary enclosure cabinet 84. Depending on the particular capacitive sensor 88 and sensitivity of same used, the predetermined distance 170 between the bottom of the capacitive sensor 88 and the sensor protector 80 outer surface that faces away from the capacitive sensor 88 can vary. With existing capacitive sensor 88, applicant believes that this distance 170 should not be greater than 2 inches, and more preferably not greater than 1 inch. With stronger sensors, i.e., sensors with stronger sensing capability, this distance may be increased. The sensor protector 80 prevents water or moisture from a user's wet hands from being deposited on a large portion the sensor area 90. The sensor protector 80 may comprise grid walls with openings formed there between or may be any of the exemplary embodiment sensor protector described herein. The sensor protector 80 is preferably formed of plastic material so as not to interfere with the sensitivity of the capacitive sensor 88. However, if the grid walls of sensor protector 80 constitute a small enough percentage of the surface area of the sensor protector 80 including the openings, it is possible for the sensor protector 80 to be made of metal (e.g., stainless steel). In such case, rather than being a separate piece that is positioned in a cutout at the bottom of the secondary enclosure cabinet 84, a series of openings can be formed directly in the secondary enclosure cabinet 84 below the sensor area 90. This perforated portion of the cabinet therefore becomes the sensor protector.

Figure 11:
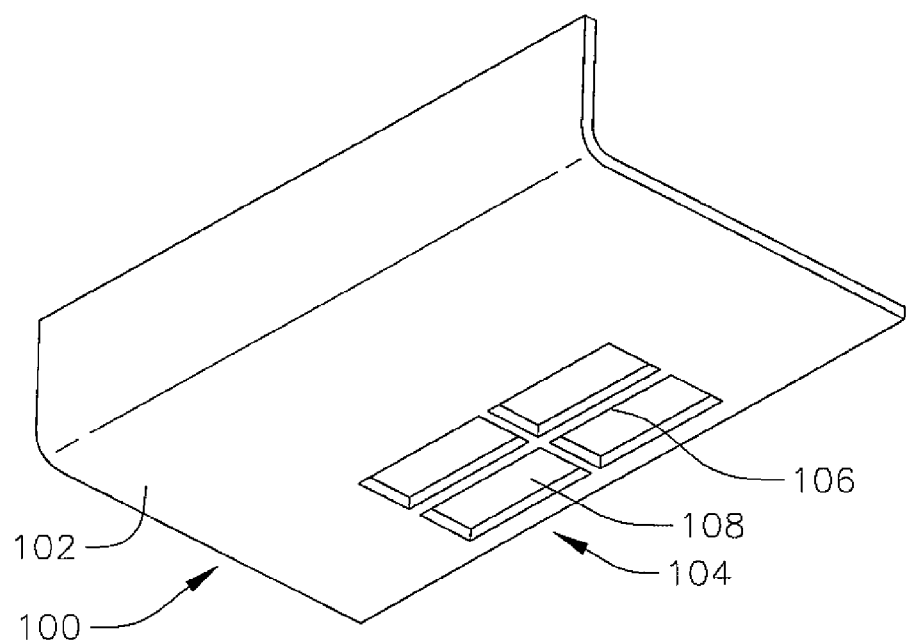
FIG. 11 is a perspective view of the exemplary sensor protector that is adapted for use with a secondary enclosure of an automatic roll paper towel dispenser.

FIG. 11 is a perspective view of an exemplary sensor protector unit 100 that is designed for use with a secondary enclosure cabinet such as shown in FIG. 10, which will contain an automatic product dispenser. The sensor protector unit 100 includes a bottom plane 102 with a sensor protection grid 104 formed therein that has grid walls 106 defining openings 108 therebetween. The sensor protector unit 100 can be attached to an enlarged opening formed in a bottom of a secondary enclosure cabinet (such as shown in FIG. 10), and an automatic product dispenser can be located inside as shown in FIG. 10, with its sensor area 84 located above the sensor protection grid 104.

The invention further provides a method for preventing recalibration from occurring in automatic product dispensers, which typically results in the sensor's inoperability during such recalibration process. The method comprises providing a sensor protector in front of a sensor area of a capacitive sensor. The sensor protector can be formed together with a housing of an automatic product dispensers in the front of the sensor area, or it can be a separate sensor protector that is attached to the front of the sensor area. Alternately, the sensor protector can be attached to an opening in a separate housing cabinet (or the separate housing cabinet can have a opening with a grid formed therein) into which the automatic product dispenser is located, with the sensor area of a capacitive sensor of the automatic product dispenser being located above the sensor protector.

Even though the sensor protector herein have been described in the context of their use for automatic roll paper towel dispensers, the sensor protector of the invention are applicable to any automatic product dispensers and other devices, wherein wetting of a sensor area causes a recalibration delay, such as faucets, soap dispensers, and air blowing hand dryers.

Although preferred embodiments of the present invention have been described, it should not be construed to limit the scope of the invention. In addition, those skilled in the art will understand that various modifications may be made to the described embodiments. Moreover, to those skilled in the various arts, the invention itself herein will suggest solutions to other tasks and adaptations for other applications. It is therefore desired that the present embodiments be considered in all respects as illustrated and not restrictive.

What is claimed is:

1. A product dispenser comprising:
   a housing comprising a sensor area;
   a capacitive sensor adjacent a first surface of the sensor area of the housing, wherein said sensor has a target sensing area extending through said first surface and beyond a second surface of the housing opposite the first surface in a direction away from the first surface; and
   a sensor protector, said sensor protector comprising a plurality of spaced apart projections extending from the second surface in said direction away from the first surface.

2. The dispenser of claim 1, wherein said projections are a plurality of crossing members defining a grid having a plurality of openings defined by said crossing members.

3. The dispenser of claim 1, wherein said projections are conical shaped.

4. The dispenser of claim 1, wherein said protector comprises a base, wherein said projections extend from the base and wherein said base is adjacent the second surface.

5. The dispenser of claim 4, wherein the projections are integrally formed with the base.

6. The dispenser of claim 1, wherein the projections are integrally formed with the second surface.

7. The dispenser of claim 1, wherein the projections extend a distance of at least ¼ inch perpendicularly away from the second surface.

8. The dispenser of claim 1, wherein the sensor activates a mechanism for dispensing a product.

9. The dispenser of claim 1, wherein the sensor activates a mechanism for dispensing paper towels.

10. A method for preventing recalibration of an automated product dispenser that includes a capacitive sensor having a target sensing area through a first surface in a section of a housing and beyond a second surface of said section of the housing opposite the first surface, wherein said dispenser dispenses a product when an object is sensed in said target sensing area, the method comprising providing a sensor protector including a plurality of spaced apart projections over a section of the second surface for reducing an amount of liquid and/or moisture being deposited on the section of the second surface.

11. The method as recited in claim 10, wherein the product is a paper towel.

12. A sensor protector for use with an automated product dispenser comprising a plurality of projections, wherein said sensor protector is mountable in the vicinity of a sensor area of a capacitive sensor of an automatic product dispenser for reducing an amount of liquid and/or moisture being deposited on the sensor area.

* * * * *